United States Patent [19]
Rey et al.

[11] Patent Number: 5,738,908
[45] Date of Patent: Apr. 14, 1998

[54] METHOD OF DENSIFYING POROUS SUBSTRATES BY CHEMICAL VAPOR INFILTRATION OF SILICON CARBIDE

[75] Inventors: Jacques Rey, Merignac; Jean-Luc Charvet, Saint Medard En Jalles; Christian Robin-Brosse, Le Haillan; Bernard Delperier, Marignas sur Jalles; Jacky Minet, Saint Medard En Jalles, all of France

[73] Assignee: Societe Europeenne de Propulsion, Suresnes, France

[21] Appl. No.: 656,347

[22] PCT Filed: Dec. 13, 1994

[86] PCT No.: PCT/FR94/01453

§ 371 Date: Jun. 14, 1996

§ 102(e) Date: Jun. 14, 1996

[87] PCT Pub. No.: WO95/16803

PCT Pub. Date: Jun. 22, 1995

[30] Foreign Application Priority Data

Dec. 16, 1993 [FR] France .................. 93 15176

[51] Int. Cl.$^6$ .................................................. C23C 16/32
[52] U.S. Cl. .................. 427/249; 427/255.1; 427/255.2; 427/589
[58] Field of Search .................. 427/249, 255.1, 427/255.7, 589

[56] References Cited

U.S. PATENT DOCUMENTS 4,823,734  4/1989  Christin .................. 118/719
5,362,228  11/1994  Vaudel .................. 432/120
5,382,453  1/1995  Mason .................. 427/249

FOREIGN PATENT DOCUMENTS 4129102  3/1993  Germany .
WO8704733  8/1987  WIPO .

OTHER PUBLICATIONS

"Safety Procedures Used During the Manufacturing of Amorphous Silicon Solar Cells", C.R. Dickson, Solar Cells, vol. 19, No. 3–4, Jan. 1987, pp. 189–201.

*Primary Examiner*—Shrive Beck
*Assistant Examiner*—Timothy Meeks
*Attorney, Agent, or Firm*—Weingarten, Schurgin, Gagnebin & Hayes LLP

[57] ABSTRACT

A reaction gas containing methyltrichlorosilane (MTS) and hydrogen is injected into the infiltration chamber (30) in which the substrate is placed and where predetermined infiltration temperature and pressure conditions obtain. The gas entering the infiltration chamber is preheated (by plates 46) so as to bring it up to temperature before coming into contact with the substrate. The residual gas containing the remainder of the reaction gas together with gaseous reaction products is extracted from the chamber. Infiltration is performed at a temperature lying in the range 960° C. to 1050° C., and preferably in the range 1000° C. to 1030° C., under a total pressure of not more than 25 kPa, and preferably equal to 7 kPa to 12 kPa, and the concentration of silicon-containing species in the residual gas is lowered at the outlet from the infiltration chamber, e.g. by injecting an inert gas (via 70).

6 Claims, 5 Drawing Sheets

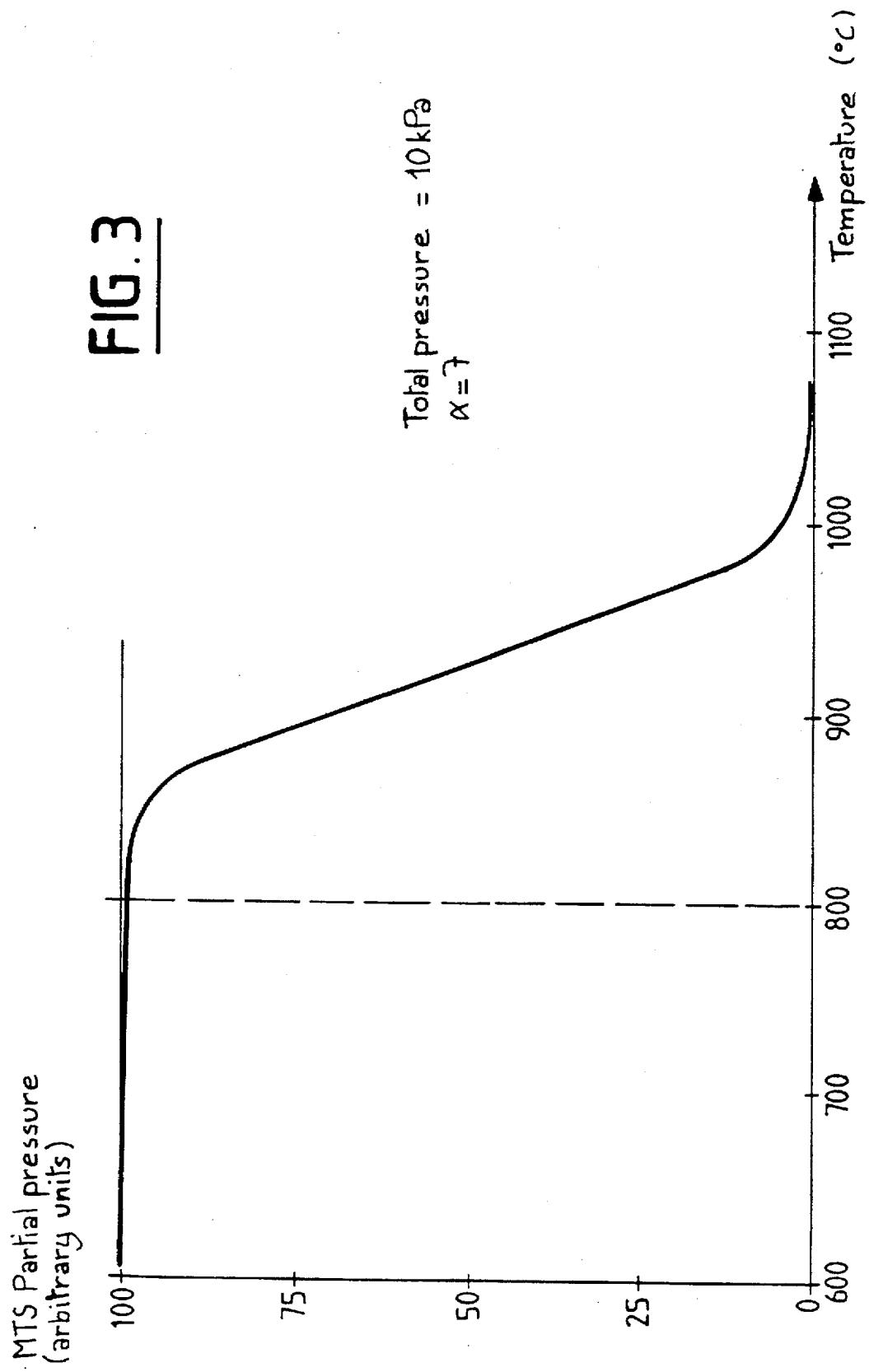

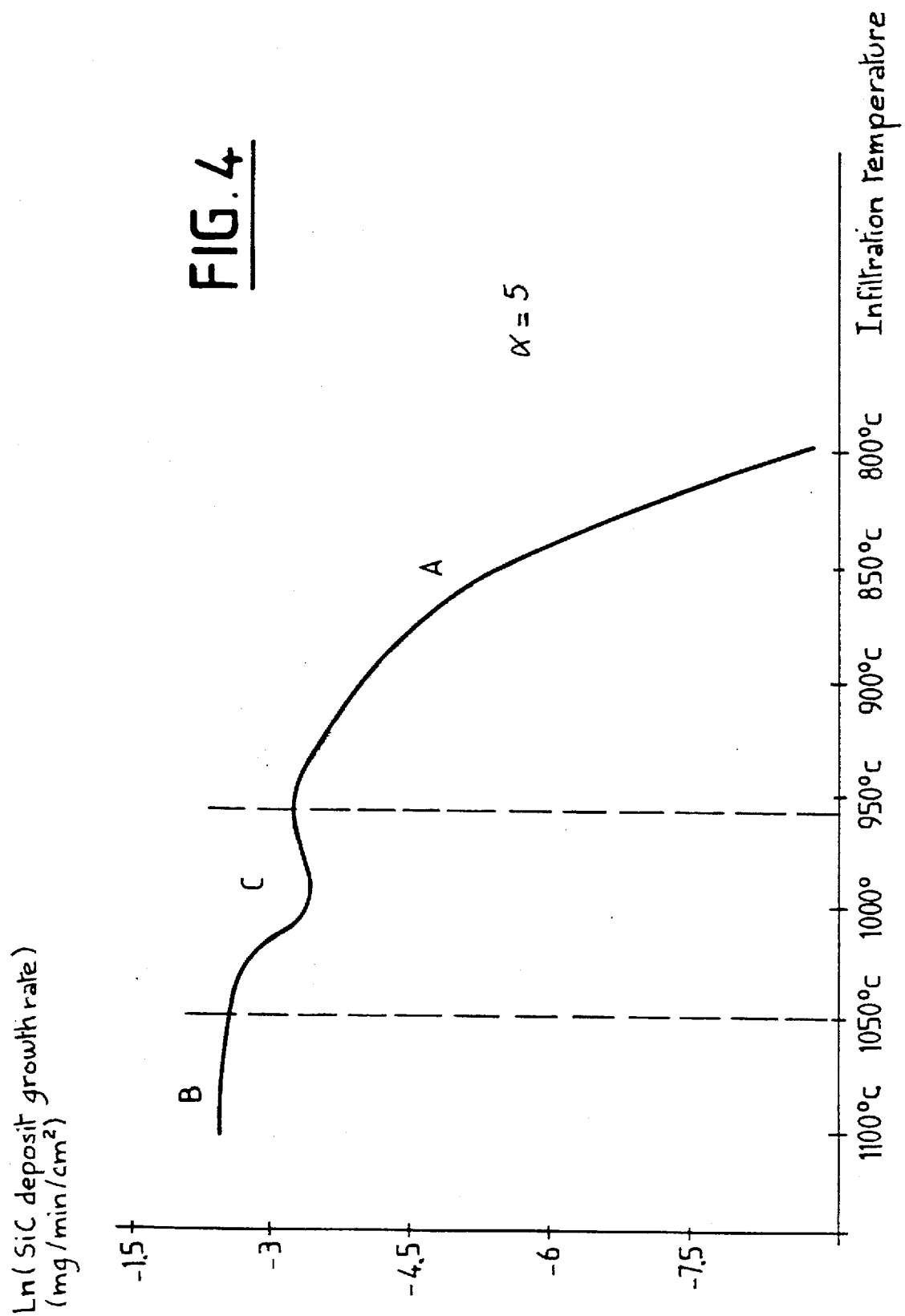

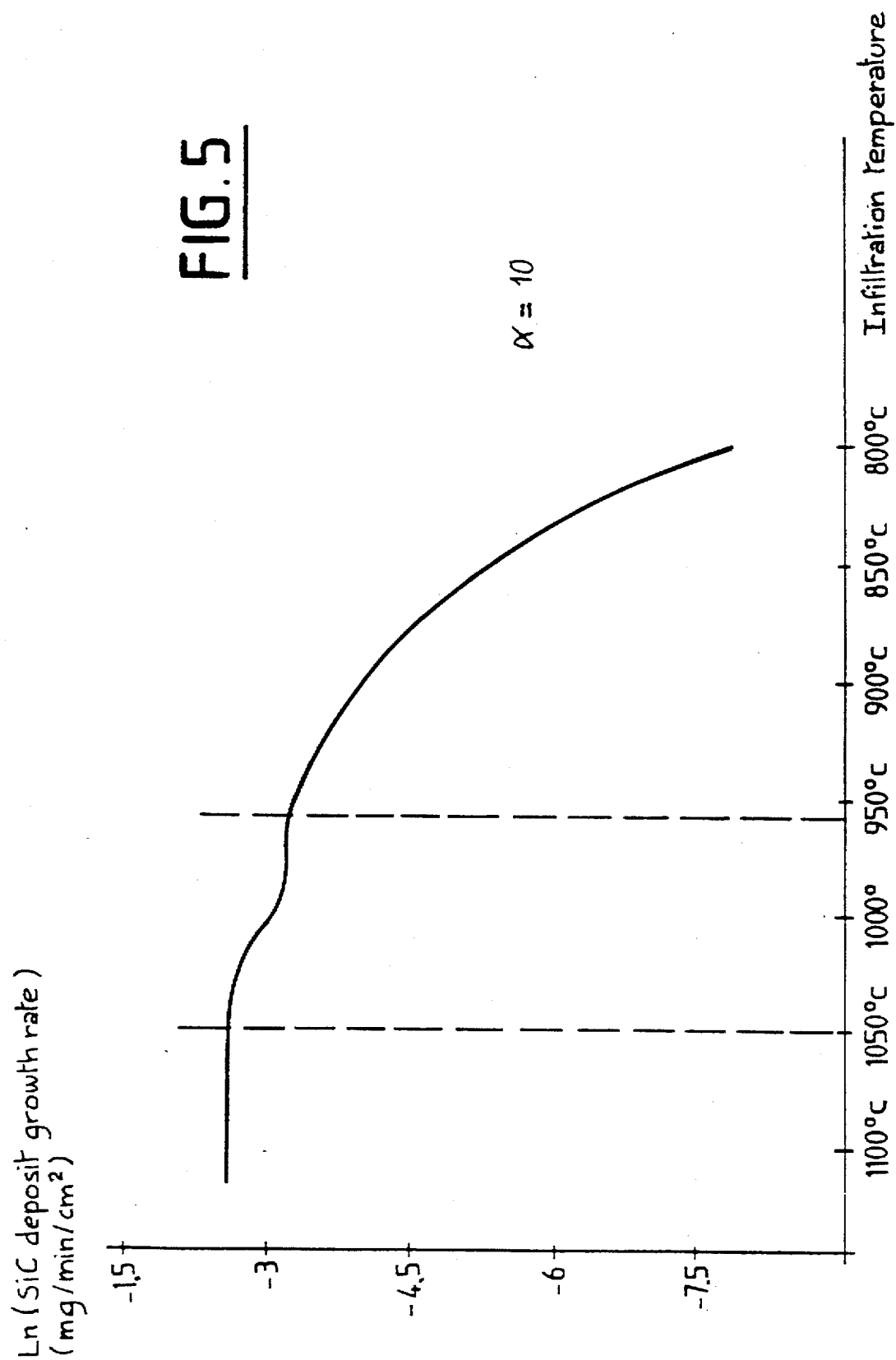

METHOD OF DENSIFYING POROUS SUBSTRATES BY CHEMICAL VAPOR INFILTRATION OF SILICON CARBIDE

FIELD OF THE INVENTION

The present invention relates to densifying porous substrates by chemical vapor infiltration of silicon carbide.

A field of the invention is that of making parts out of thermostructural composite material having a matrix that is made at least in part out of silicon carbide. Such parts are suitable for use, in particular, in aviation, or in space, or in the field of friction because they have mechanical properties which make them suitable for constituting structural elements and because they have the ability to conserve said properties at high temperatures.

BACKGROUND OF THE INVENTION

The manufacture of thermostructural composite material parts generally comprises making a substrate or preform out of refractory fibers, in particular carbon fibers or ceramic fibers, and densifying the preform with the matrix-constituting material.

Methods of densifying a porous substrate with a silicon carbide matrix are well known.

The invention relates to the method of densification by chemical vapor infiltration. In this method, the substrate to be densified is placed in an infiltration chamber. A reactive gas generally comprising a mixture of methyltrichlorosilane (MTS) and hydrogen is admired into the chamber. The temperature and pressure conditions are adjusted so as to enable the gas to diffuse into the pores of the substrate right into the core thereof and form a deposit of silicon carbide by decomposition of MTS in the presence of hydrogen which acts as a reducing agent:

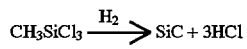

$$CH_3SiCl_3 \xrightarrow{H_2} SiC + 3HCl$$

Chemical vapor infiltration requires special control of operating conditions to enable the substrate to be densified right into its core in a manner that is as uniform and as complete as possible. Under poorly controlled conditions, there is a risk of a solid deposit forming on the surface, thereby rapidly obstructing the internal pores of the substrate and preventing any further densification of the core. The implementation of chemical vapor infiltration is thus different from the implementation of chemical vapor deposition methods as are used for forming surface coatings.

Various chemical vapor infiltration methods are known, in particular temperature gradient and/or pressure gradient methods, and also the constant temperature and constant pressure method.

With the temperature and/or pressure gradient methods, temperature and/or pressure differences are established between the surfaces of the substrate that are exposed to the reactive gas and the internal portions of the substrate remote from the exposed surfaces, which differences favor formation of the matrix initially in the internal portions of the substrate. Densification progresses towards the exposed surfaces, thereby achieving a result that is relatively uniform.

The temperature gradient method is implemented by heating the substrate either indirectly by causing the internal surfaces of the substrate to come into contact with an induction core that is heated by induction, or else by direct inductive coupling when the nature of the substrate makes that possible. The application of that method is limited to substrates that are simple in shape.

The pressure gradient method requires a forced flow to be established through the substrate and therefore requires equipment that matches the shape thereof.

Unfortunately, the duration of chemical vapor infiltration cycles as performed on an industrial scale makes it necessary to use a method that makes it possible to densify a plurality of substrates simultaneously inside the same chamber, which substrates may be of various or complex shapes.

Under such circumstances, the constant temperature and pressure method is used, and attempts are made to adjust the temperature and the pressure within the enclosure to optimum values for ensuring that densification takes place as uniformly as possible right into the core of substrates of various shapes and thicknesses, with this occurring throughout the working volume of the chamber.

One such chemical vapor infiltration method for infiltrating silicon carbide is described in document FR-A-2 401 888. The recommended temperature range lies between the temperature at which MTS begins to decompose and said temperature plus 150° C., and preferably said temperature plus 100° C., i.e. a range of about 800° C. to 950° C., and preferably of 800° C. to 900° C.

The recommended total pressure inside the chamber preferably lies between several hundreds and several thousands of Pa.

An installation enabling said method to be implemented on an industrial scale is described in document FR-A-2 594 119. The reaction gas penetrating into the chamber is preheated so as to be raised to the temperature that obtains therein prior to coming into contact with the substrate that is to be densified. Preheating is performed by causing the reaction gas to pass in contact with preheating plates situated inside the chamber. The residual gas constituted by the remainder of the reaction gas and the gaseous products of the reaction is extracted from the chamber by pumping.

In spite of infiltration conditions being accurately controlled, the constant temperature and pressure method gives rise to extra deposit forming on the surfaces of substrates. During a densification process, it is therefore commonplace to remove partially-densified substrates from the infiltration chamber at least once in order to remove caked deposit therefrom, i.e. in order to machine the surfaces thereof so as to fully reopen access to the residual internal pores. Such intermediate operations further lengthen the duration of densification cycles.

SUMMARY OF THE INVENTION

An object of the present invention is to propose a method of chemical vapor infiltration of silicon carbide that is more particularly adapted to being implemented under industrial conditions.

More precisely, the present invention seeks to provide a method enabling the speed of densification to be increased while conserving uniform densification of the porous substrate right into the core thereof.

Another object of the invention is to provide a method that ensures better reproducibility of densification characteristics, whether for different substrates or for implementation in different installations.

These objects are achieved by a method of the type comprising a constant temperature and constant pressure method of densifying a porous substrate by chemical vapor infiltration of silicon carbide, the method comprising placing the substrate in an infiltration chamber, injecting a reaction gas containing methyltrichloro-silane and hydrogen into the infiltration chamber in which predetermined infiltration temperature and pressure conditions obtain, preheating the gas entering the infiltration chamber so as to bring it up to temperature before making contact with the substrate, and extracting the residual gas from the infiltration chamber, which gas includes the remainder of the reaction gas and the products of gaseous reaction, in which method, according to the invention, infiltration is performed at a temperature lying in the range 960° C. to 1050° C. under a total pressure of not more than 25 kPa, and the concentration of silicon-containing species in the residual gas is lowered at the outlet from the infiltration chamber.

Preferably, infiltration is performed at a temperature lying in the range 1000° C. to 1030° C.

One of the characteristics of the invention lies in the relatively high level of the infiltration temperature. In above-mentioned document FR-A-2 401 888, the recommended temperature range is 800° C. to 950° C., i.e. a temperature that is little greater than the temperature at which MTS begins to decompose.

However, the Applicant has been able to show that a higher temperature can be used in combination with preheating of the reaction gas, without giving rise to drawbacks. A greater densification gradient does not appear, while the speed of densification, which is related to temperature, is increased thereby.

Also, the densification process turns out to be quite insensitive to small variations of temperature in the selected range, thus making it possible to guarantee good reproducibility of the method on an industrial scale.

According to another characteristic of the method of the invention, infiltration is performed at a relatively low total pressure, no greater than 25 kPa, and preferably lying in the range 7 kPa to 12 kPa, and the concentration of the silicon-containing species in the residual gas is lowered at the outlet from the infiltration chamber.

For given pumping capacity, the requirement for relatively low total pressure inside the infiltration chamber can prevent significant dilution of the reaction gas by an inert gas unless the flow rates of MTS and of $H_2$ are considerably reduced, thereby reducing the speed of densification. Thus, the presence of silicon-containing gas species at a high concentration at the outlet from the infiltration chamber favors the formation of undesirable condensates, and is even particularly dangerous on the walls of the pipework downstream from the chamber. Lowering the concentration of silicon-containing gas species in the residual gas reduces the risk of such deposits being formed.

This lowering of concentration can be achieved by injecting an inert gas into the residual gas immediately on leaving the infiltration chamber. It may also be achieved by causing the residual gas to pass in contact with and/or through one or more substrates in a dilution zone situated downstream from the infiltration chamber.

DESCRIPTION OF THE DRAWINGS

The invention will be better understood on reading the following description given by way of non-limiting indication and made with reference to the accompanying drawings, in which:

FIG. 3 is a graph showing the influence of temperature on the decomposition of MTS; and FIGS. 4 and 5 are graphs showing the variation in the growth rate of silicon carbide as a function of infiltration temperature respectively for two different values of the ratio a between the rates of flow of $H_2$ and of MTS as injected into the infiltration chamber.

DESCRIPTION OF THE PREFERRED EMBODIMENT(S)

The method of the invention can be implemented on various types of porous substrate. The substrate may constitute fiber preforms that are close in shape to the shapes of the composite parts to be made. The fibers of the preform, e.g. carbon fibers or ceramic fibers, may previously be coated in a layer for the purpose of forming an interphase between the fibers and the silicon carbide matrix, e.g. a layer of pyrolytic carbon or of boron nitride as described in document EP 0 172 082. The fiber preform may even have been densified in part, e.g. by pyrolytic carbon, with densification being continued by the silicon carbide matrix, thereby providing a two-component (or two-phase) matrix made of carbon and of silicon carbide.

Figure 1:
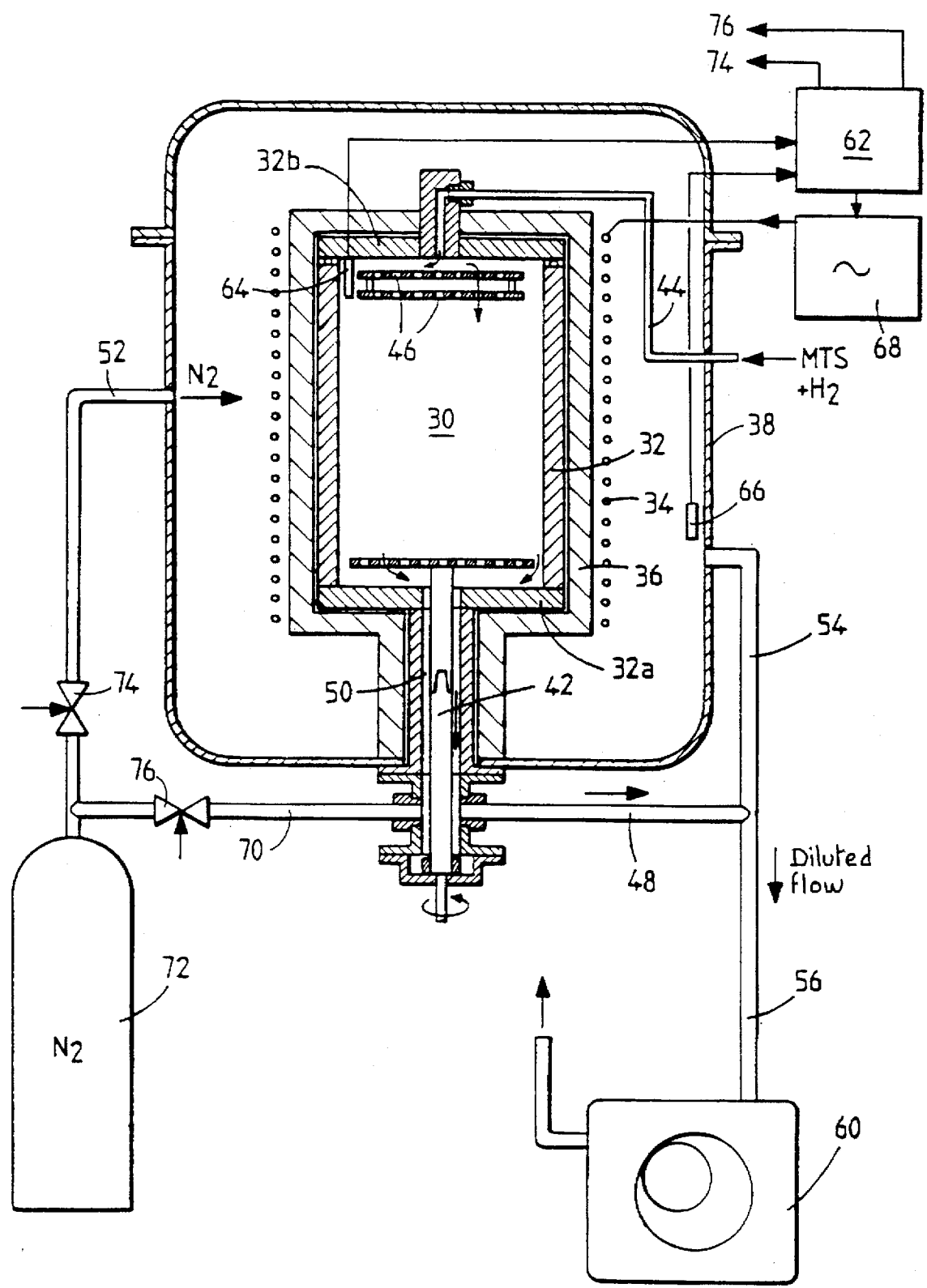
FIG. 1 is a diagrammatic section view of a chemical vapor infiltration installation enabling the method of the invention to be implemented.

The method of the invention can be implemented in an installation as shown in FIG. 1.

This installation is derived from that shown in above-described document FR-A-2 594 119.

The infiltration installation comprises an infiltration chamber 30 defined by a graphite core 32. The core 32 is surrounded by a metal inductor 34 with thermal insulation 36 being interposed therebetween. The assembly is housed inside a gastight metal enclosure 38.

The core 32 in the form of a vertical axis cylinder that is closed at its bottom end by a bottom 32a and at its top end by a removable cover 32b. Inside the chamber 30, preforms to be densified with silicon carbide are placed on a perforated tray 40 and optionally held in place by tooling. The tray 40 can rotate about a vertical axis coinciding with the axis of the chamber 30. Rotation is driven by a motor (not shown) coupled to the tray by means of a shaft 42 passing through the bottom 32a.

The reaction gas containing MTS and hydrogen coming from supplies (not shown) is injected into the chamber via a feed pipe 44 which passes through the enclosure 38 and terminates at the top end of the chamber through the cover 32b. The reaction gas penetrating into the chamber 30 is constrained to flow in contact with preheating plates. These comprise superposed perforated plates 46 suitable for raising the reaction gas quickly to the temperature that obtains inside the chamber.

The residual gas is extracted via one or more pipes 48 implemented in the bottom of the chamber 30 via an annular passage 50 surrounding the shaft 42.

The volume situated around the core 32 inside the enclosure 38 is continually swept by an inert gas such as nitrogen. This comes from a supply 72 and it is conveyed via a pipe 52 through a valve 74. It is extracted from the enclosure 38 via a pipe 54. A buffer of inert gas is thus formed around the chamber 30.

Outside the enclosure, the pipes 48 and 54 are united so as to form a single pipe 56 connected to a pumping device 60.

A control unit 62 receives signals representative of the temperature and the pressure inside the chamber as delivered by respective sensors 64 and 66. The sensor 66 is located inside the enclosure 38 and outside the chamber 30, the enclosure and the chamber being at equal pressures. The control unit 62 controls a generator 68 which feeds electricity to the inductor 34 so as to maintain the temperature inside the chamber 30 at the predetermined value for the chemical vapor infiltration operation. The control unit 62 is also connected to the valve 74 for controlling the flow of nitrogen injected via the pipe 52 so as to maintain the pressure inside the chamber 30 at the desired value.

According to a characteristic of the method, the control unit 62 controls the generator 68 so as to maintain the temperature inside the chamber 30 at a value lying in the range 960° C. to 1050° C., and preferably in the range 1000° C. to 1030° C.

FIG. 3 shows how the partial pressure of MTS varies as a function of temperature inside an enclosure into which there is admitted a gas made up of MTS and of $H_2$. The ratio a between the $H_2$ flow rate and the MTS flow rate is equal to 7, and the pressure inside the enclosure is equal to 10 kPa.

Decomposition of MTS begins at about 800° C. and it is complete above about 1050° C.

FIG. 4 shows how the rate of growth R of a silicon carbide deposit varies as a function of temperature for a ratio $\alpha=5$ and a total pressure equal to 10 kPa.

At lower temperatures (region A) from about 800° C. to about 950° C., the deposition growth rate increases with temperature. Deposition kinetics are constrained, and thus controlled, by a reaction process stage at the surface of the preform.

At higher temperatures (region B), above about 1050° C., deposition kinetics are controlled by diffusion in a boundary layer constituted by the interface between the dynamic reaction gas and the surface of the substrate. Deposition kinetics become relatively independent of temperature, but diffusion through the boundary layer depends on the thickness of the layer, which thickness varies locally as a function of the aerodynamic diffusion conditions in the preform.

In order to ensure that deposition takes place uniformly both within a given preform and throughout the volume of the chamber 30, it is therefore necessary to find deposition conditions that are controlled by a surface reaction and not deposition conditions that are controlled by diffusion through a boundary layer.

On an industrial scale, it is advantageous to occupy not only a region of reaction kinetics that is governed by a surface reaction, but also that exists at the highest available temperature of said region so as to benefit from the highest possible densification speeds.

It is also advantageous to favor control over reaction kinetics by a surface reaction process stage which limits as much as possible any risk of the reaction kinetics decreasing as the reaction gas diffuses into the pores of the preform or flows throughout the reaction chamber. It is then necessary to prevent the deposition kinetics being controlled by the quantity of a source species that is present locally, since that would lead to favoring phenomena that dilute the reaction gas, and instead it is appropriate to look for the reaction kinetics being controlled by a species that is a result of the reaction, and in the present case hydrogen chloride, HCl.

The curve in FIG. 4 shows that there exists a local minimum which is situated in the increasing temperature direction immediately before the region in which reaction kinetics are governed by diffusion through a boundary layer. This special region C in which reaction kinetics continue to be governed by a surface reaction corresponds to reaction being limited by the presence of HCl adsorbed onto the surface of the preform. By occupying this inhibition region, a high rate of densification is obtained while favoring uniform deposition both within the preform and throughout the reaction chamber.

This region C corresponds to a temperature range of about 960° C. to about 1050° C., in the example shown in FIG. 4. The same applies to the example shown in FIG. 5 which differs from that of FIG. 4 by having a ratio $\alpha$ that is equal to 10 instead of 5.

On sight of the curves in FIGS. 4 and 5, the search for the highest possible infiltration temperature without moving into region B where reaction kinetics are governed by diffusion through a boundary layer, makes it preferable to select an infiltration temperature in the range 1000° C. to 1030° C.

In order to ensure that the above-described effect occurs, it is advantageous for the reaction gas to be raised to the desired infiltration temperature before it diffuses into the preform. This is achieved by preheating the gas by means of the preheating plates 46 which are permanently at the temperature that obtains inside the chamber 30 as regulated by the control unit 62.

In addition, the curves of FIGS. 4 and 5 show that in the inhibition region C, local variation in temperature has little effect on the rate of deposit growth (unlike region A). In practice it is very difficult to maintain a temperature accurately at a predetermined value throughout the preform and the infiltration chamber. Local differences are inevitable, e.g. due to masking of radiation by the preform or to limits on convection effects at low pressures. By selecting the temperature range of the invention it is thus possible to obtain the advantage of making deposition kinetics relatively independent of temperature while remaining under surface reaction conditions.

According to another characteristic of the method, the total pressure in the infiltration chamber 30 is maintained at a value that does not exceed 25 kPa, and that lies preferably in the range 7 kPa to 12 kPa, so as to favor diffusion of the reaction gas into the core of the preform to be densified.

For given pumping capacity, this relatively low pressure can turn out to be incompatible with the reaction gas phase being greatly diluted by an inert gas.

Thus, the residual gas extracted from the enclosure contains a relatively high fraction of silicon-containing species. In addition to un-decomposed MTS, species such as chlorosilanes, hydrogen chlorosilanes, and organosilanes may be present. These by-products of MTS decomposition may polycondense on cold walls downstream from the infiltration chamber, thereby giving rise to unstable condensates.

The Applicant has been able to show that such condensates are quickly hydrolyzed by contact with air. A passivating layer of inert hydrated silica thus forms on the surface of the condensate and acts as a diffusion barrier against oxygen. Nevertheless, beneath said layer, transformation of the condensate is partial only and unstable compounds such as chlorosiloxanes or silanols are formed. If condensate deposition is considerable, this phenomenon of partial transformation does not reach into the core of the condensate.

The same oxidation mechanism is possible if condensation takes place on a wall that has already been coated in hydrated silica during earlier infiltration cycles. Surface passivation thus takes place in part before any contact with air.

Sudden destruction of the passivating surface layer causes the condensate to burst into flame since the underlying unstable compounds decompose violently on contact with air. These reactions are highly exothermal and they therefore give rise to the core of the un-affected condensate being heated, which itself then gives off flammable vapor.

If a surface-passivated condensate is maintained on the walls during subsequent cycles, it continues to transform progressively and becomes ever more unstable. Only a period of very long duration in air is capable of achieving complete passivation.

Thus, in the presence of such condensates on the walls of a pipe, any manipulation by an operator gives rise to a considerable risk of burns. At any moment, additional energy supplied by such minor means as friction from a tool or from a rag or the removal of the passivating layer can suffice to cause the wall to burst into flame.

It is therefore advantageous to prevent these condensates forming, and for this purpose to lower the concentration of silicon-containing species in the residual gas leaving the chamber 30. In the installation of FIG. 1, this is achieved by injecting a diluting gas at the outlet from the chamber 30. Injection is achieved by a pipe 70 which terminates in the passage 50 immediately outside the enclosure 38. The pipe 70 is fed with inert gas, e.g. nitrogen taken from the supply 72 via a valve 76 controlled by the control unit 62. Naturally, the capacity of the pumping device 60 and the control thereof are adapted to make it possible to maintain the desired pressure inside the chamber in spite of said additional injection.

Various tests have been performed with the FIG. 1 installation in order to demonstrate the effectiveness of diluting the residual gas in order to prevent the formation of undesirable condensates on the walls of the outlet pipes 48 and 56. Those tests have been performed for various different values of total pressure $P_t$ in the chamber 30, different values of the ratio R between the flow rate of $H_2$ and the flow rate of MTS in the reaction gas, different values of the total flow rate of the reaction gas, and different values of the dilution factor $F_d$ of the residual gas by nitrogen. The values of R and D are given in comparison with reference values $R_1$ and $D_1$. The dilution factor $F_d$ is given relative to the flow rate of nitrogen $D(N_2)$ injected via the pipe 70, and the total sum of the nitrogen flow rate $D(N_2)$ and the flow rates of the gases injected by the feed pipe 44, D(MTS) and $D(H_2)$.

$$F_d = \frac{D(N_2)}{D(MTS + H_2) + D(N_2)}$$

The following table gives the results observed concerning the presence and the nature of unstable condensates on the walls of the outlet pipes.

| Total pressure $P_t$(kPa) | Ratio R $D(H_2)/D(MTS)$ | Total flow rate D | $F_d$ | Condensates present | Comments |
|---|---|---|---|---|---|
| 15 | $R_1$ | $D_1$ | 0,70–0,75 | NO | |
| 10 | $R_1$ | $D_1$ | 0,60–0,65 | YES | Unstable |
| 8,5 | $R_3(>R_1)$ | $D_1$ | 0,55–0,60 | YES | whitish |
| 8,5 | $R_2(<R_1)$ | $D_2(<D_1)$ | 0,65–0,70 | YES | paste |
| 8,5 | $R_1$ | $D_3(>D_1)$ | 0,90–0,95 | NO | |
| 2 | $R_3(>R_1)$ | $D_1$ | 0,45–0,50 | YES | Very |
| 2 | $R_1$ | $D_2(<D_1)$ | 0,60–0,65 | YES | unstable brown viscous liquid |
| 2 | $R_2(<R_1)$ | $D_3(>D_1)$ | 0,85–0,90 | NO | |

These results show that the dilution factor must be not less than 0.7.

Figure 2:
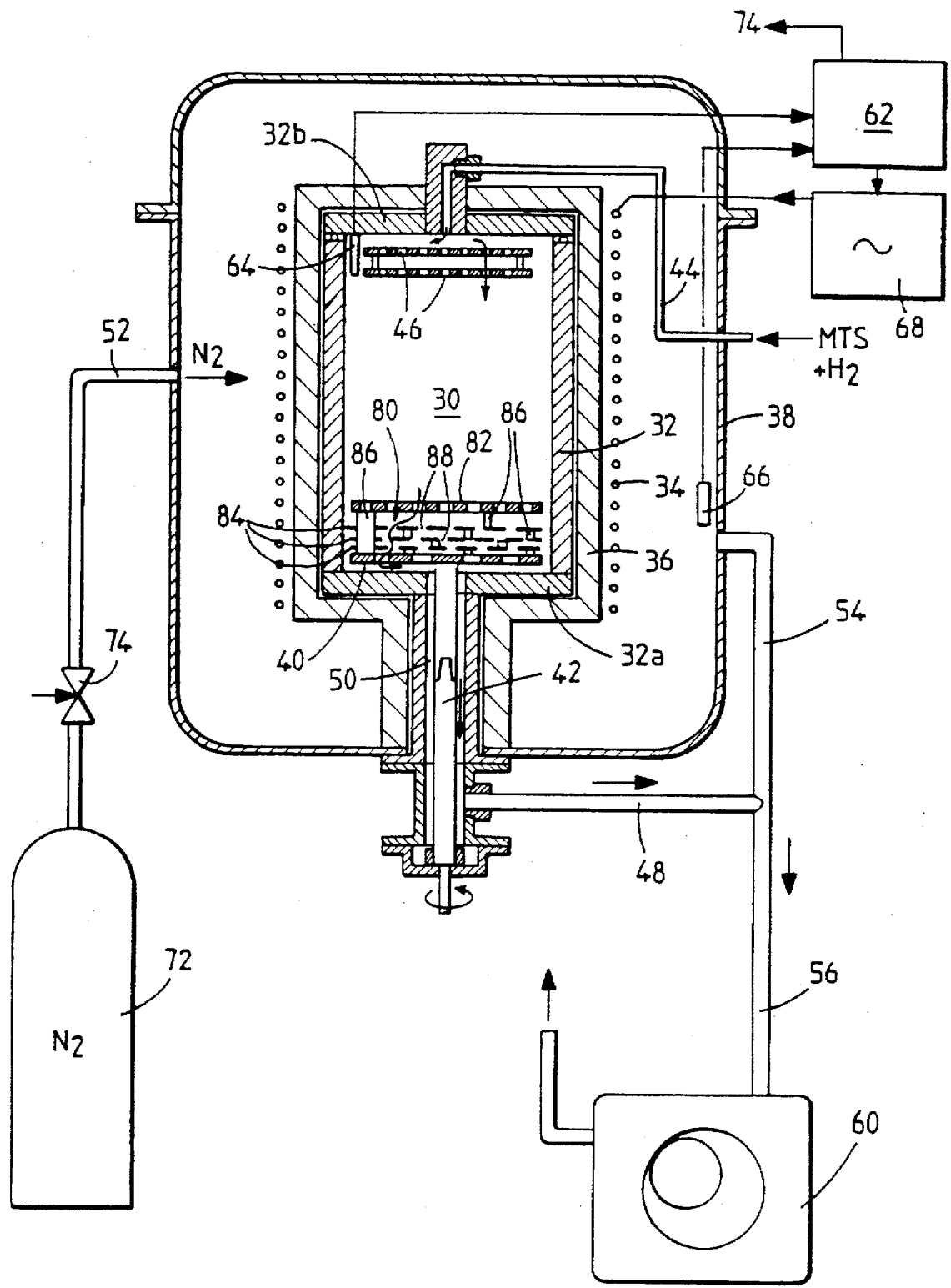
FIG. 2 shows a variant embodiment of a chemical vapor infiltration installation enabling the method of the invention to be implemented.

FIG. 2 shows another embodiment of the means for enabling the concentration in silicon-containing species to be reduced in the residual gas.

The installation of FIG. 2 differs from that of FIG. 1 firstly in that the means for feeding dilution gas to the outlet of the chamber are omitted, and secondly in that a dilution zone is provided immediately upstream from the outlet of the enclosure. Elements common to the installations of FIGS. 1 and 2 are given the same references.

The dilution zone 80 is situated at the bottom of the enclosure 38, between the load-carrying tray 40 and a working load top tray 82 situated thereabove. The trays 40 and 82 are constituted by two parallel perforated plates (e.g. made of graphite) that are held spaced apart from each other by spacers 84 (likewise made of graphite).

The dilution zone thus defined by the trays 40 and 82 is fitted with fiber substrates in the form of disks 84 disposed one above another. The disks 84 are held spaced apart slightly from one another and spaced apart from the trays 40 and 82 by graphite spacers 86. The disks 84 have openings 88 disposed in a staggered configuration so as to constrain the residual gas to follow a sinuous path between the chamber 30 proper as situated above the tray 82 and the outlet from the enclosure 38.

The same temperature and pressure conditions obtain in the dilution zone 80 as in the chamber 30. The residual gas diffusing through the substrates 84 is diluted with respect to reaction species that give rise to silicon carbide being deposited. As a result, the substrates 84 become denser and the residual gas extracted from the enclosure 38 is diluted in silicon-containing species. Depending on their degree of densification, the substrates 84 are changed or are not changed after one complete infiltration operation.

Tests have been performed using three carbon fiber felt disks as substrates 84, each of a thickness of 3 mm and having a fiber volume content of 6% (percentage of the apparent volume of the disk that is indeed occupied by the fibers). An increase in reaction yield of 50% was observed relative to the case where no dilution zone is provided. In other words, the percentage of silicon-containing species that were combined prior to extraction of the residual gas from the enclosure was increased by 50%. As a result, there was a sufficient reduction in the concentration of un-combined silicon-containing species to avoid unstable condensates being formed.

It may be observed that the dilution zone cannot be considered as being an extension of the working infiltration zone in a way that would make it possible to consider densifying preforms to make composite material parts in the dilution zone.

Firstly, there are constraints concerning the shapes, dimensions, and porosity of substrates disposed in the dilution zone.

Secondly, the residual gas penetrating into the dilution zone does not necessarily have the appropriate composition for depositing silicon carbide with the desired microtexture and/or with the desired uniformity of densification.

The substrates densified in the dilution zone must be sacrificed.

Naturally, the means envisaged above for lowering the concentration of silicon-containing species in the residual gas can be combined by providing the installation of FIG. 2 with a pipe for injecting dilution gas as in the installation of FIG. 1.

We claim:

1. A method of densifying a porous substrate by chemical vapor infiltration of silicon carbide, the method comprising:

placing the substrate in an infiltration chamber;

injecting a reaction gas comprising methyltrichlorosilane and hydrogen into the infiltration chamber having a flow rate ratio of hydrogen to methyltrichlorosilane of 5:1 to 10:1;

preheating the gas entering the infiltration chamber so as to bring it up to a temperature of 960° C. to 1050° C. before making contact with the substrate;

maintaining a temperature within the range of 960° C. to 1050° C. and a pressure of not more than 25 kPa within the infiltration chamber, whereby a fraction of the reaction gas is allowed to react and form a deposit of silicon carbide within the porous substrate, leaving a residual gas which comprises silicon-containing species including undecomposed methyltrichlorosilane and gaseous by-products of decomposition of methyltrichlorosilane; and extracting the residual gas from the infiltration chamber by pumping through a pipe connected to an outlet of the infiltration chamber, while causing the concentration of the silicon-containing species in the residual gas to be lowered immediately at the outlet from the infiltration chamber to avoid the formation of unstable condensates on walls of said pipe.

2. The method according to claim 1, further comprising maintaining the temperature within a range of 1000° C. to 1030° C. within the infiltration chamber.

3. The method according to claim 1, further comprising maintaining the pressure within a range of 7 kPa to 12 kPa.

4. The method according to claim 1, wherein the concentration of silicon-containing species in the residual gas is lowered by diluting the residual gas with an inert gas immediately at the outlet from the infiltration chamber.

5. The method according to claim 4, wherein a ratio between a flow rate of the inert gas and a sum of flow rates of the reaction gas plus the inert gas is not less than 0.7.

6. The method according to claim 1, wherein the concentration of silicon-containing species in the residual gas is lowered by passing the residual gas in contact with and/or through at least one substrate in a dilution zone situated downstream from the infiltration chamber, before reaching the pipe.

* * * * *

UNITED STATES PATENT AND TRADEMARK OFFICE
CERTIFICATE OF CORRECTION

PATENT NO. : 5,738,908
DATED : April 14, 1998
INVENTOR(S) : Jacques Rey, et al.

It is certified that error appears in the above-identified patent and that said Letters Patent is hereby corrected as shown below:

Column 1, line 30, "admired" should read --admitted--.
Column 5, line 21, "ratio a" should read --ratio $\alpha$--.

Signed and Sealed this

Nineteenth Day of October, 1999

Attest:

Q. TODD DICKINSON

*Attesting Officer*    *Acting Commissioner of Patents and Trademarks*